US012635199B2

(12) United States Patent
Ostermaier

(10) Patent No.: US 12,635,199 B2
(45) Date of Patent: May 19, 2026

(54) MULTI-CHANNEL HIGH ELECTRON MOBILITY TRANSISTOR WITH REDUCED INPUT CAPACITANCE

(71) Applicant: Infineon Technologies Austria AG, Villach (AT)

(72) Inventor: Clemens Ostermaier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 563 days.

(21) Appl. No.: 18/118,980

(22) Filed: Mar. 8, 2023

(65) Prior Publication Data

US 2024/0304670 A1    Sep. 12, 2024

(51) Int. Cl.
| | |
|---|---|
| *H10D 62/17* | (2025.01) |
| *H10D 30/01* | (2025.01) |
| *H10D 30/47* | (2025.01) |
| *H10D 62/85* | (2025.01) |
| *H10D 64/23* | (2025.01) |
| *H10D 64/64* | (2025.01) |

(52) U.S. Cl.
CPC ......... *H10D 62/235* (2025.01); *H10D 30/015* (2025.01); *H10D 30/475* (2025.01); *H10D 62/8503* (2025.01); *H10D 64/251* (2025.01); *H10D 64/64* (2025.01)

(58) Field of Classification Search
None
See application file for complete search history.

(56) References Cited

U.S. PATENT DOCUMENTS

| | | | |
|---|---|---|---|
| 9,035,355 | B2 | 5/2015 | Ostermaier et al. |
| 9,647,104 | B2 | 5/2017 | Ostermaier et al. |
| 9,837,520 | B2 | 12/2017 | Ostermaier et al. |
| 10,128,228 | B1 | 11/2018 | Gao et al. |

(Continued)

OTHER PUBLICATIONS

Shinohara, Keisuke, et al., "Multi-channel Schottky-gate Bridge HEMT Technology for Millimeter-Wave Power Amplifier Applications", 2022 IEEE/MTT-S International Microwave Symposium, 2022, 298-3001.

(Continued)

*Primary Examiner* — Khaja Ahmad
(74) *Attorney, Agent, or Firm* — Murphy, Bilak & Homiller, PLLC

(57) ABSTRACT

A high-electron mobility transistor includes a semiconductor body including a plurality of type III-nitride semiconductor layers stacked on top of one another, thereby forming a plurality of two-dimensional first charge type gas channels and at least one two-dimensional second charge type gas channel vertically in between two of the two-dimensional first charge type gas channel, source and drain electrodes that are laterally spaced apart from one another and in ohmic contact with the plurality of two-dimensional first charge type gas channel, a gate structure configured to control a conductive connection between the source and drain electrodes by controlling a conductive state of the plurality of two-dimensional first charge type gas channels, and a charge dissipation structure that is configured to remove second charge type carriers from the two-dimensional second charge type gas channel during an off-state of the high-electron mobility transistor.

13 Claims, 6 Drawing Sheets

(56) References Cited

U.S. PATENT DOCUMENTS

| 11,257,941 | B2 | 2/2022 | Detzel et al. | |
| 2013/0134443 | A1 | 5/2013 | Terano et al. | |
| 2013/0334573 | A1* | 12/2013 | Ostermaier | H01L 21/30604 |
| | | | | 257/E21.403 |
| 2015/0221748 | A1 | 8/2015 | Ostermaier et al. | |
| 2016/0247905 | A1 | 8/2016 | Ostermaier et al. | |
| 2017/0125562 | A1* | 5/2017 | Prechtl | H10D 62/8503 |
| 2018/0219086 | A1 | 8/2018 | Higuchi et al. | |
| 2019/0267454 | A1* | 8/2019 | Matioli | H10D 64/111 |
| 2021/0234028 | A1* | 7/2021 | Detzel | H10D 62/343 |

OTHER PUBLICATIONS

Xiao, M., et al., "Multi-Channel Monolithic-Cascode HEMT (MC2-HEMT): A New GaN Power Switch up to 10 kV", 2021 IEEE International Electron Devices Meeting (IEDM), 2021, 1-4.

Ma, Yunwei, et al., "Tri-Gate GaN Junction HEMTs: Physics and Performance Space", IEEE Transactions on Electron Devices, vol. 68, No. 10, Oct. 2021, 4854-4861.

Raj, Aditya, et al., "GaN/AlGaN Superlattice Based E-Mode Hole Channel FinFET With Schottky Gate", IEEE Electron Device Letters, vol. 44, No. 1, Jan. 9-12, 2023.

\* cited by examiner

MULTI-CHANNEL HIGH ELECTRON MOBILITY TRANSISTOR WITH REDUCED INPUT CAPACITANCE

BACKGROUND

HEMTs (high-electron-mobility Field Effect Transistors) also known as heterostructure FETs (HFETs) and modulation-doped FET (MODFETs) offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example. Designers are constantly seeking ways to improve the performance of HEMTs, e.g., power consumption and voltage blocking capability. Exemplary device parameters that designers seek to improve include leakage current, threshold voltage ($V_{TH}$), drain-source on-state resistance ($R_{DSON}$), and maximum voltage switching capability, to name a few. Multi-channel HEMTs that utilize more than one device channel are currently under investigation. This device concept advantageously lowers the on-resistance of the device by including multiple conduction paths in parallel between the source and drain of the device. Current multi-channel HEMT designs involve making unwanted tradeoffs between drain-source on-state resistance ($R_{DSON}$) and input capacitance.

SUMMARY

A high-electron mobility transistor is disclosed. According to an embodiment, the high-electron mobility transistor comprises a semiconductor body comprising a plurality of type III-nitride semiconductor layers stacked on top of one another, thereby forming a plurality of two-dimensional first charge type gas channels and at least one two-dimensional second charge type gas channel vertically in between two of the two-dimensional first charge type gas channels, source and drain electrodes that are laterally spaced apart from one another and in ohmic contact with the plurality of two-dimensional first charge type gas channel, a gate structure configured to control a conductive connection between the source and drain electrodes by controlling a conductive state of the plurality of two-dimensional first charge type gas channels, and a charge dissipation structure that is configured to remove second charge type carriers from the two-dimensional second charge type gas channel during an off-state of the high-electron mobility transistor.

A method of forming a high-electron mobility transistor is disclosed. According to an embodiment, the method comprises providing a semiconductor body comprising a plurality of type III-nitride semiconductor layers stacked on top of one another, thereby forming a plurality of two-dimensional first charge type gas channels and at least one two-dimensional second charge type gas channel vertically in between two of the two-dimensional first charge type gas channels, forming source and drain electrodes that are laterally spaced apart from one another and in ohmic contact with the plurality of two-dimensional first charge type gas channel, forming a gate structure that is configured to control a conductive connection between the source and drain electrodes by controlling a conductive state of the plurality of two-dimensional first charge type gas channels, and forming a charge dissipation structure that is configured to remove second charge type carriers from the two-dimensional second charge type gas channel during an off-state of the high-electron mobility transistor.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a cross-sectional view of the high-electron-mobility field effect transistor, and FIG. 1B illustrates a plan-view of the high-electron-mobility field effect transistor.

FIG. 2, which includes FIG. 2A illustrates a cross-sectional view of the high-electron-mobility field effect transistor, and FIG. 2B illustrates a plan-view of the high-electron-mobility field effect transistor.

DETAILED DESCRIPTION

Embodiments of a high-electron-mobility field effect transistor with a mutli-channel configuration and an advantageously low input capacitance are described herein. The high-electron-mobility field effect transistor is formed in a semiconductor body that comprises multiple layer pairs of channel and barrier regions. These layer pairs form a plurality of two-dimensional first charge type carrier gas channels (e.g., 2DEG channels) and two-dimensional second charge type carrier gas channels (e.g., 2DHG channels) that alternate with one another in a vertical direction of the semiconductor body. The two-dimensional first charge type carrier gas channels form the active device channels that conduct first charge type carriers between the source and drain electrodes of the device. This multi-channel concept advantageously lowers the on-resistance/area of the device by providing multiple conduction paths in parallel. However, the presence of at least one two-dimensional second charge type carrier gas channel between the first charge type carrier gas channels creates a large capacity for second charge type carriers to be stored in the drift path of the semiconductor body. This can delay switching times and/or require increased gate driving capability. The embodiments of the high-electron-mobility field effect transistor disclosed herein advantageously include a charge dissipation structure that dissipates the second charge type carriers from the drift region of the device during an off-state, thereby eliminating the need for these second charge type carriers to be removed by the gate structure and consequently improving input capacitance and switching delays.

Figures 1, 1A:
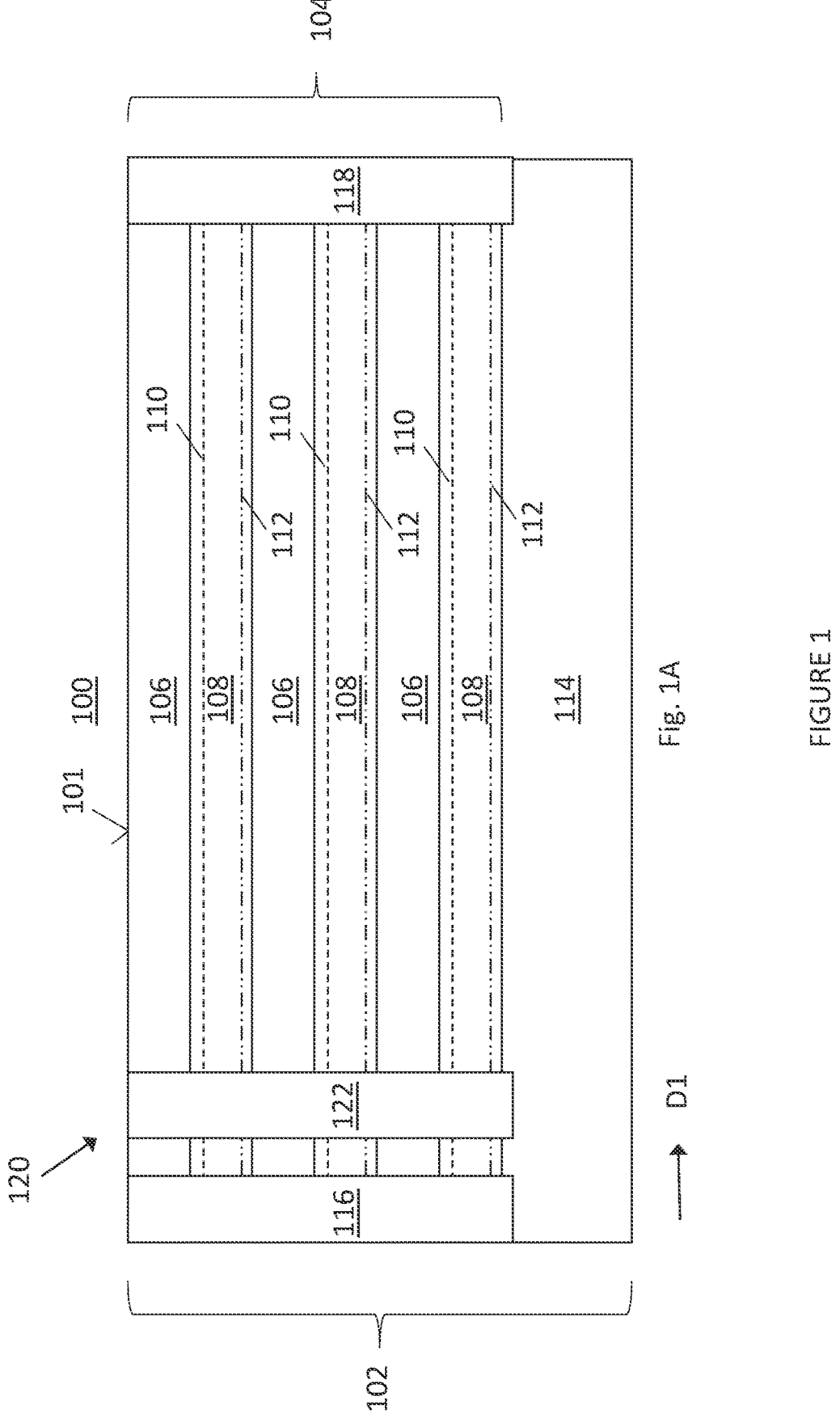
FIG. 1, which includes
FIGS. 1A and 1B, illustrates a high-electron-mobility field effect transistor, according to an embodiment.

Referring to FIG. 1, a high-electron mobility transistor 100 is formed in a semiconductor body 102. The semiconductor body 102 comprises a channel region 104 that comprises a plurality of type III-nitride semiconductor layers stacked on top of one another. These type III-nitride semiconductor layers are arranged in layer pairs, wherein each layer pair comprises a barrier layer 106 and a channel layer 108. The barrier layer 106 is formed from a material with a different bandgap as the channel layer 108. The bandgap difference may result from a difference in metal alloy concentration of the III-nitride semiconductor material from each layer. For example, the barrier layer 106 may be a layer of $Al_xGa1_{-x}N$ and the channel layer 108 may be a layer of $Al_yGa1_{-y}N$, wherein x>y. As a result of the bandgap difference between the barrier layer 106 and the channel layer 108 from each layer pair, a two-dimensional charge carrier gas channel arises near each heterojunction interface. Due to the polarization fields, the two-dimensional charge carrier gases form with opposite polarities in an alternating manner along a vertical direction of the semiconductor body. In particular, the channel region 104 comprises a plurality of two-dimensional first charge type gas channels 110 and a plurality of two-dimensional second charge type gas channels 112, with the second charge carrier type being opposite from the first conductivity type. For example, the two-dimensional first charge type gas channels 110 may correspond to 2DEG (two-dimensional electron gas) channels and the two-dimensional second charge type gas channels 112 may correspond to 2DHG (two-dimensional hole gas) channels. Depending on the ordering of the layers and/or the material selection of an uppermost layer of the layer stack, the uppermost two-dimensional charge carrier gas channel can be a 2DEG or a 2DHG.

The semiconductor body 102 further comprises a substrate region 114 below the channel region 104. The substrate region 114 corresponds to a portion of the semiconductor body 102 that does not contain an active device channel. The substrate region 114 may comprise multiple regions or layers of material that are not specifically identified in the figure. For example, the substrate region 114 may comprise a base substrate that is used as a seed region to epitaxially grow type III-nitride semiconductor material thereon. This base substrate may comprise a variety of semiconductor materials such as silicon (Si), sapphire, silicon carbide (SiC) or silicon germanium (SiGe), etc. According to an embodiment, the base substrate corresponds to a commercially available semiconductor wafer, such as a bulk silicon wafer or a SOI (silicon on insulator) wafer. The substrate region 114 may additionally comprise a lattice transition region that is configured to alleviate mechanical stress attributable to crystalline lattice mismatch between a base substrate and the semiconductor material of the channel region 104, e.g., a lattice mismatch between silicon and GaN/AlGaN. Separately or in combination, the substrate region 114 may comprise a back-barrier region immediately underneath the lowermost channel layer 108 of the channel region 104 that is used to increase carrier confinement and prevent leakage through the substrate region 114.

The high-electron mobility transistor 100 comprises source and drain electrodes 116, 118 that are formed in the upper surface 101 of the semiconductor body 102 and extend into the channel region 104. The source and drain electrodes 116, 118 are laterally spaced apart from one another in a current flow direction D1 of the device. Furthermore, the source and drain electrodes 116, 118 are in ohmic contact with each of the two-dimensional first charge type gas channels 110. The source and drain electrodes 116, 118 may be formed by trenches that extend through the channel region 104 to reach the substrate region 114. These trenches may be filled with a semiconductor material of the first conductivity type, thereby forming an ohmic connection with the two-dimensional first charge type gas channels 110. For example, in the case that the two-dimensional first charge type gas channels 110 are 2DEG channels, the source and drain electrodes 116, 118 may comprise n-type type III-nitride semiconductor material, e.g., n-type GaN/AlGaN.

The high-electron mobility transistor 100 comprises a gate structure 120 that is formed in the upper surface 101 of the semiconductor body 102 and extends into the channel region 104. The gate structure 120 is arranged laterally between the source and drain electrodes 116, 118 in a current flow direction D1 of the device. The gate structure 120 may be formed by a plurality of trenches that extend through the channel region 104 to reach the substrate region 114. The gate structure 120 is configured to locally deplete and repopulate the two-dimensional first charge type gas channels 110 in the vicinity of the gate structure 120 in a manner that will be further described below. According to an embodiment, the gate structure 120 comprises second conductivity type semiconductor material that is doped to create a local electric field that depletes two-dimensional first charge type gas channels 110 in the vicinity of the gate structure 120. For example, in the case that the two-dimensional first charge type gas channels 110 are 2DEG channels, the gate structure 120 may comprise p-type type III-nitride semiconductor material, e.g., p-type GaN/AlGaN.

The high-electron mobility transistor 100 may comprise additional layers and/or structures on the upper surface 101 of the semiconductor body 102 that are not shown for the sake of simplicity. These additional layers and/or structures may comprise further semiconductor layers, e.g., capping layers, electrically insulating layers and/or protective layers, e.g., passivation layers, interlayer dielectrics, etc., metallization layers, e.g., metal contact pads, bond pads, etc.

Figures 1, 1B:
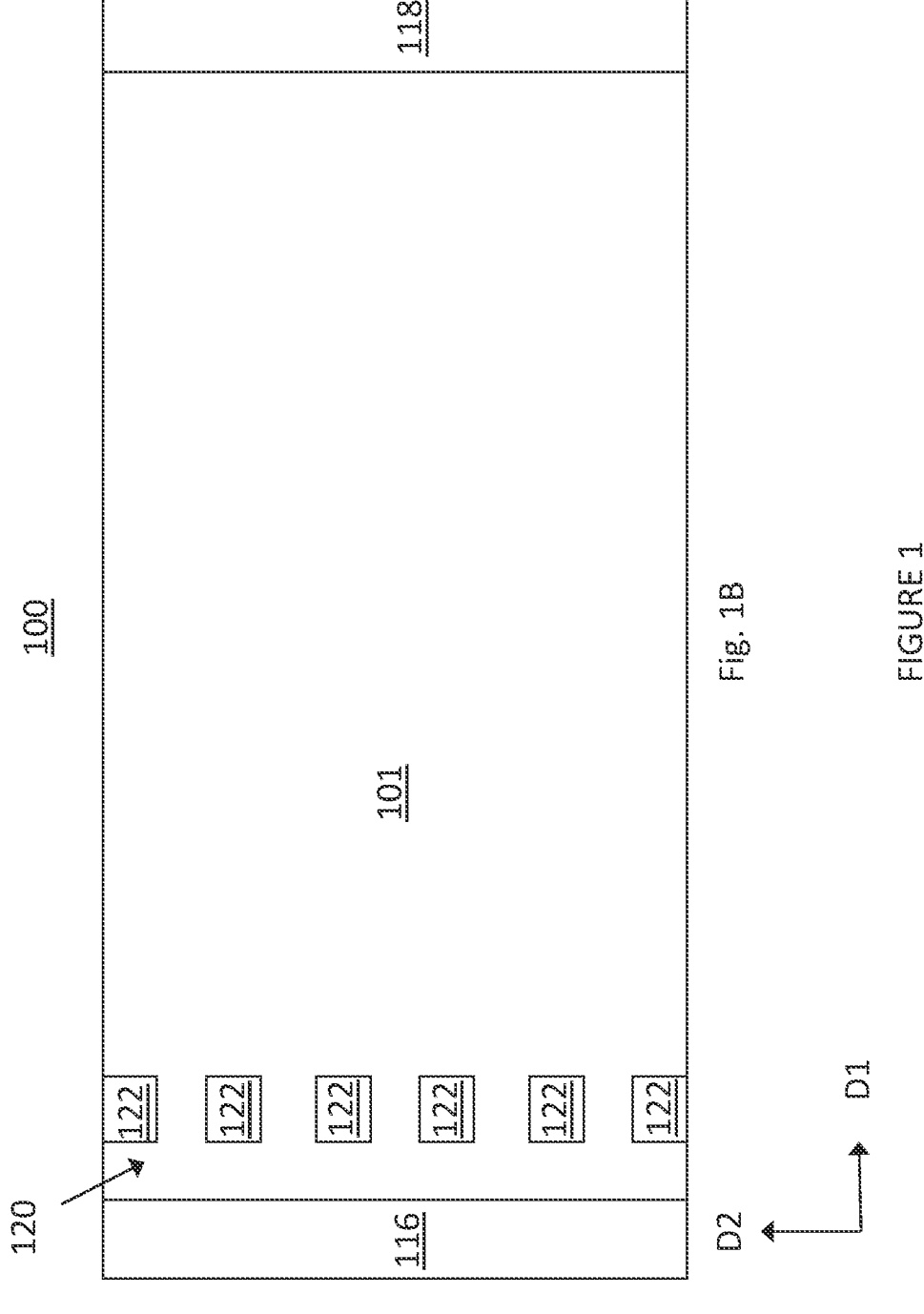

The working principle of the high-electron mobility transistor 100 is as follows. The high-electron mobility transistor 100 is configured to control a load current flowing between the source and drain electrodes 116, 118 via the two-dimensional first charge type gas channels 110. The gate structure 120 is configured to control a conductive state of each of the two-dimensional first charge type gas channels 110, thereby providing on-off control. As shown, the gate structure 120 comprises a plurality of gate columns 122 that are laterally spaced apart from one another in a second lateral direction D2 that is perpendicular to the current flow direction D1. In this arrangement, the load current flows through portions of the channel region 104 that are in between the gate columns 122. These portions can be referred to as gate fin regions. The high-electron mobility transistor 100 is configured to completely deplete and repopulate the two-dimensional first charge type gas channels 110 within the gate fin regions, dependent upon an applied bias between the gate structure 120 and the source electrode 116, thereby providing on-off control. The threshold voltage of the high-electron mobility transistor 100 can be determined by the physical parameters of the gate structure 120, such as the dopant concentration of the gate columns 122, size of the gate columns 122, and spacing between the gate columns 122 in the second lateral direction D2 (seen in FIG. 1B). The high-electron mobility transistor 100 may be a so-called normally off device. According to this configuration, the parameters of the gate columns 122 and spacing between the gate columns 122 are selected such that the two-dimensional first charge type gas channels 110 within the gate fin regions are completely depleted and hence non-conductive at zero gate-source bias.

According to an embodiment, the gate structure 120 has a p-n junction gate configuration. This gate configuration includes a p-n junction between the gate structure 120 and each of the active device channels. For example, in the case that the two-dimensional first charge type gas channels 110 are 2DEG channels, the gate structure 120 may comprise p-type type III-nitride semiconductor material, e.g., p-type GaN/AlGaN, that directly interfaces with each of the two-dimensional first charge type gas channels 110. In this case, the 'n' region of the p-n junction corresponds to the 2DEG which forms the active device channel.

According to another embodiment, the gate structure 120 has a MIS (metal insulator semiconductor) gate configuration. This gate configuration comprises a metal gate electrode, e.g., an electrode comprising Cu, Al, etc., and a layer of electrically insulating material, e.g., $SiO_2$, SiN, etc., that electrically isolates the gate electrode from each of the two-dimensional first charge type gas channels 110. A variation of this structure replaces the metal electrode with a highly conductive semiconductor material, such as highly doped polysilicon.

According to another embodiment, the gate structure 120 has a Schottky gate configuration. According to this gate configuration, the gate structure 120 comprises a metal Schottky contact material that directly interfaces with the GaN/AlGaN of each layer pair from the channel region 104 and forms a Schottky junction with the type-III nitride material.

While being necessary to realize the multi-channel design, the two-dimensional second charge type gas channels 112 within the semiconductor body 102 create a large capacity for second charge type carriers to be stored within the semiconductor body 102 that can contribute undesirable device behavior. Among other things, the second charge type carriers from the two-dimensional second charge type gas channels 112 must be extracted before the device can be turned off, thus leading to slow switching speeds. The exact role of the two-dimensional second charge type gas channels 112 may depend upon the type of gate structure 120. In the case of a p-n junction gate configuration, the presence of the two-dimensional second charge type gas channels 112 has both benefits and drawbacks. Because there is a direct connection between the gate structure 120 and each of the second charge carrier type gas channels 112, the second charge carrier type gas channels 112 can serve as an extension of the gate structure 120 by fully extending above and below the two-dimensional first charge carrier type gas channels 110, thereby having enhanced depletion control. However, because there is a low-ohmic connection whereby second charge type carriers may flow freely between the gate structure 120 and each of two-dimensional second charge type gas channels 112, this also means that the gate structure 120 is in full control of each of the second charge type carriers within the drift region of the device, thus leading to very slow switching times and/or increased gate driving needs. In the case of a gate structure 120 wherein some form of electrical isolation is provided between the gate electrode and the two-dimensional second charge type gas channels 112, e.g., a MIS gate configuration or a Schottky gate configuration, the second charge type carriers cannot flow as easily between the two-dimensional second charge type gas channels 112 and the gate structure 120. However, the potential of the device still favors second charge type carriers to be collected near the gate structure 10 and leakage paths may exist between gate structure 10 and the two-dimensional second charge type gas channels 112.

Figure 2A:
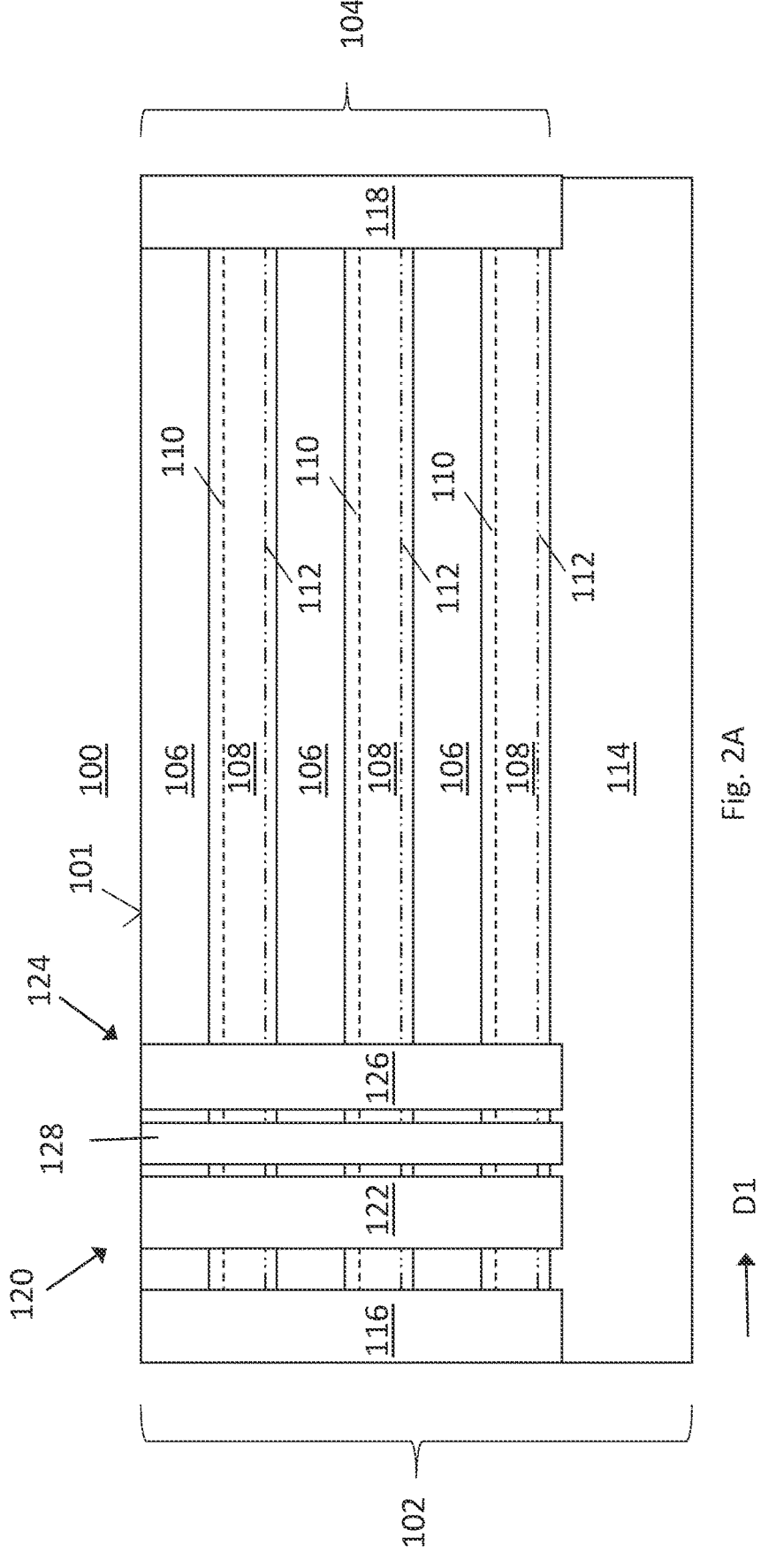
FIGS. 2A and 2B, illustrates a high-electron-mobility field effect transistor, according to an embodiment.

Referring to FIG. 2, a high-electron mobility transistor 100 comprises a charge dissipation structure 124. The charge dissipation structure 124 is configured to remove second charge type carriers from the two-dimensional second charge type gas channels 112 during an off-state of the device. To this end, the charge dissipation structure 124 comprises an electrode structure that is in low ohmic contact with each of the two-dimensional second charge type gas channels 112 within the channel region 104. This electrode structure is set to a potential that removes second conductivity type two-dimensional charge carriers from the two-dimensional second charge type gas channels 112 during an off-state of the device. For example, the charge dissipation structure 124 can be connected to the same potential as the source electrode 116, e.g., through a direct ohmic connection with the source electrode 116 and/or to node that is at an equivalent potential as the source electrode 116. As a potential difference builds during a turn off operation, the second conductivity type two-dimensional charge carriers within the two-dimensional second charge type gas channels 112 flow into the charge dissipation structure 124.

According to an embodiment, the charge dissipation structure 124 comprises one or more regions of second conductivity type semiconductor material that extend into the channel region 104. The second conductivity type semiconductor material of the charge dissipation structure 124 directly interfaces with each of the two-dimensional second charge type gas channels 112 and thus forms a low-ohmic path for second charge type carriers to flow therebetween. For example, in the case that the two-dimensional second charge type gas channels 112 are 2DHG channels, the charge dissipation structure 124 may comprise one or more regions of p-type type III-nitride semiconductor material, e.g., p-type GaN/AlGaN, that is in direct contact with the 2DHG channels.

Figure 2B:
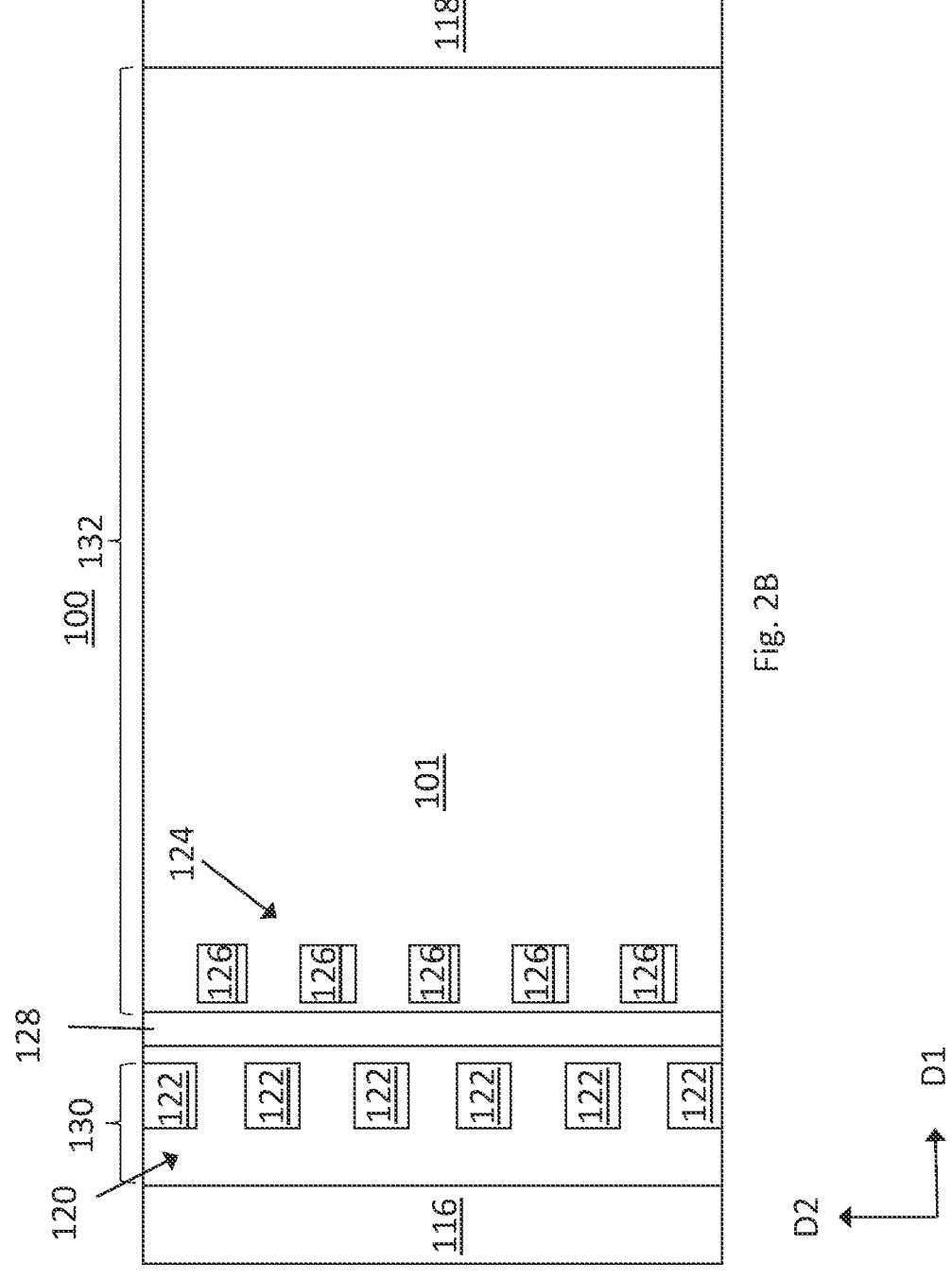

According to the depicted embodiment of FIG. 2, the charge dissipation structure 124 comprises a plurality of charge dissipation columns 126 that are laterally spaced apart from one another in the second lateral direction D2 (as shown in FIG. 2B). The charge dissipation columns 126 can be formed by trenches that extend into the semiconductor body 102 and are filled with second conductivity type semiconductor material in a similar manner as described above with respect to the gate columns 122. However, as will be explained in further detail below, the parameters of the charge dissipation columns 126 may differ from the gate columns 122 to obtain different behavior.

The high-electron mobility transistor 100 additionally comprises a barrier structure 128 that is laterally in between the gate structure 120 and the charge dissipation structure 124 in the current flow direction D1 of the device. The barrier structure 128 bisects the channel region 104 of the device into two distinct regions, namely a first device region 130 and an access region 132. The barrier structure 128 is configured to isolate the gate structure 120 from each of the two-dimensional second charge type gas channels 112 within the access region 132. Stated another way, the barrier structure 128 presents an energy barrier that prevents second charge type carriers from flowing between the access region 132 to first device region 130 and consequently into the gate structure 120 while not presenting an energy barrier to first charge type carriers.

According to an embodiment, the barrier structure 128 comprises a region of first conductivity type semiconductor material that extends into the channel region 104 and directly interfaces with each of the two-dimensional first charge type gas channels 110 within the channel layer 108. The barrier structure 128 may be formed from a trench that extends through the layer pairs type of III-nitride semiconductor layers to reach the substrate region 114 and is filled with first conductivity type semiconductor material. In the case that the two-dimensional first charge type gas channels 110 are 2DEG channels, the barrier structure 128 may comprise n-type GaN. The parameters, e.g., dopant concentration, width, etc., of the barrier structure 128 can be selected to create a depletion region that prevents transportation of second charge type carriers from the access region 132 to the first device region 130, thus providing the above-described barrier configuration.

The high-electron mobility transistor 100 of FIG. 2 can be conceptualized as two devices connected between the source and drain electrodes 116, 118. A first device that is disposed within the first device region 130 conducts between the source electrode 116 and the barrier structure 128 via the two-dimensional first charge type gas channels 110. The conduction state of this first device is actively controlled by a gate-source bias applied to the gate structure 120 as described above with reference to FIG. 1. This first device can be a normally-on device or a normally-off device. A second device that is disposed within the access region 132 conducts between the barrier structure 128 and the drain electrode 118 via the two-dimensional first charge type gas channels 110. The second device is not actively controlled. The second device is a normally-on device. In this configuration, the charge dissipation columns 126 form a passive gate structure that pinches off the two-dimensional first charge type gas channels 110 only after the first device turns off and the drain-source voltage reaches a certain level.

The parameters of the charge dissipation columns 126 can be selected such that the charge dissipation structure 124 behaves as a normally-on gate in the access region 132 with a higher threshold voltage than the gate structure 120. That is, the charge dissipation structure 124 can be designed such that the fin regions between the charge dissipation columns 126 become depleted after the fin regions between the gate columns 122 become depleted. This discrepancy in threshold voltage can be realized by any one or more of the following: a lower dopant concentration of the charge dissipation columns 126 than in the gate columns 122, a greater spacing between the charge dissipation columns 126 in the second lateral direction D2 than in the gate columns 122, a lower amount of net charges in the charge dissipation columns 126 than in the gate columns 122, e.g., through some combination of dopant concentration, size, or both.

The parameters of the barrier structure 128 can be selected to balance a variety of considerations. As the barrier structure 128 is used to prevent second charge type carriers from the access region 132 to flow through the gate structure 120, the barrier structure 128 should have enough first charge type carriers to create a potential barrier, e.g., depletion region for second charge type carriers. However, the dopant concentration of the barrier structure 128 should not be sufficiently high to cause high electric fields in off-state condition when the barrier structure 128 is being depleted. Exemplary dopant concentration values for the semiconductor material of the barrier structure 128 may be in the range of $10^{16}$ dopant atoms/cm$^3$-$5\times10^{19}$ dopant atoms/cm$^3$. The width of the barrier structure 128 in the current flow direction D1 can be made as low as possible to limit the influence of the semiconductor material with a relatively unfavorable carrier mobility comparison to the two-dimensional first charge type gas channels 110. In the case that the barrier structure 128 is formed in a trench, a width of this trench can correspond to a minimum trench width dictated by processing capability. One issue that may arise is the trapping of first charge type carriers in the barrier structure 128. At high drain-source potentials, the two-dimensional first charge type gas channels 110 in between the charge dissipation columns 126 may become depleted before depleting all free charges in the barrier structure 128. This will cause a delay in switching and will require these carriers to be transported through the structure at a later point in time, thereby increasing the power dissipation of the device. Thus, the total charges within the barrier structure 128 should be selected such that Q_Gate(VDrain)<=Q_CDS(VDrain), wherein Q_Gate is the charge depleted by the gate structure 120 and Q_CDS is the charge depleted by the charge dissipation structure 124. This parameter can be selected by appropriate tailoring of the spacing between the charge dissipation columns 126 which determines the width of the semiconductor fins in between the charge dissipation columns 126. This fin width needs to be sufficiently wide in relative to the barrier structure 128 to ensure this relationship.

The high-electron mobility transistor 100 of FIG. 2 advantageously can drain the entire two-dimensional second charge type gas channels 112 during turn off. This allows for an ideal electric field shaping in the access region 132 with no effective charges. Moreover, the barrier structure 128 in combination with the charge dissipation structure 124 advantageously facilitate this ideal electric field shaping without using the gate structure 120 to transport the second type charge carriers. This advantageously lowers the input capacitance (i.e., gate capacitance) and shifts the charges to the output capacitance of the device. Resonant topologies as well as hard switching topologies strongly benefit from this shift. As can be seen, the proportions of the device can be skewed to make the access region 132 much larger than the first device region 130. For example, a distance between the source electrode 116 and the barrier structure 128 can be between 5% and 25% of a distance between the source electrode 116 and the drain electrode 118. As a result, most of the charges are conducted by the access region 132 portion of the device.

Figure 3:
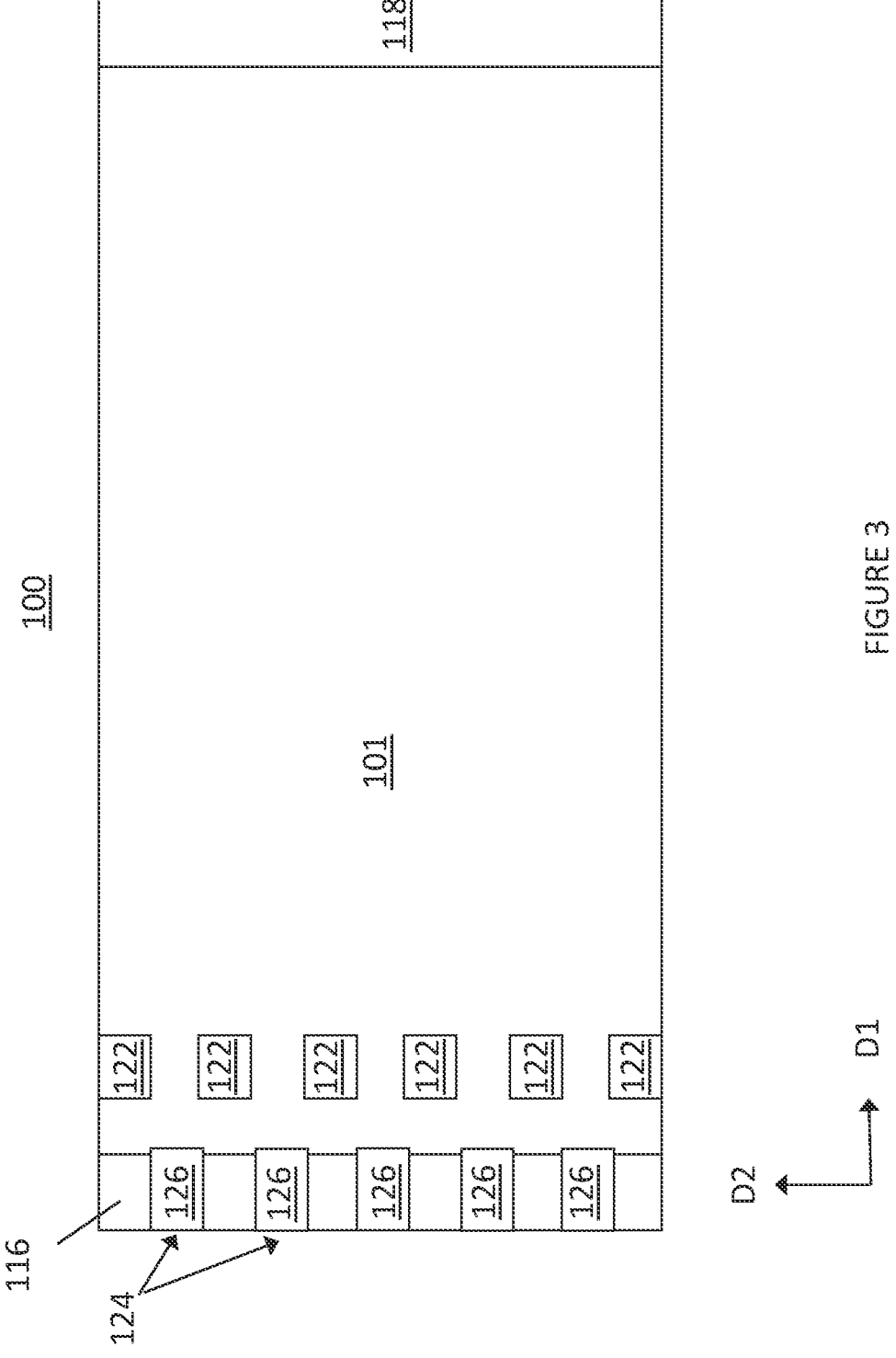
FIG. 3 illustrates a plan-view of a high-electron-mobility field effect transistor, according to an embodiment.

Referring to FIG. 3, a high-electron mobility transistor 100 comprises a charge dissipation structure 124 that is arranged to at least partially overlap with the source electrode 116. This arrangement allows for a single source pad to be formed over the charge dissipation structure 124 and the source electrode 116 and form an electrical connection thereto. As shown, the high-electron mobility transistor 100 can be configured to comprise multiple charge dissipation columns 126 interleaved with the source electrode 116. The combined structure can be realized by a sequence of deposition and etching. For example, a single trench can be formed and filled by first conductivity type semiconductor material, e.g., n-type GaN/AlGaN, to form the source electrode 116. A plurality of trenches can be formed in the source electrode 116 and filled with second conductivity type semiconductor material, e.g., p-type GaN/AlGaN, to form the charge dissipation structure 124. A similar technique can be performed with the opposite conductivity type materials.

In the embodiment of FIG. 3, the charge dissipation structure 124 operates in a similar manner as described above by draining the entire two-dimensional second charge type gas channels 112 of the device during off-state. In this embodiment, the barrier structure 128 has been omitted from the device. This device concept may be suitable for gate configurations that already include electrical isolation between the gate electrode and the two-dimensional second charge type gas channels 112, e.g., the MIS gate configuration or the Schottky gate configuration as discussed above.

Figure 4:
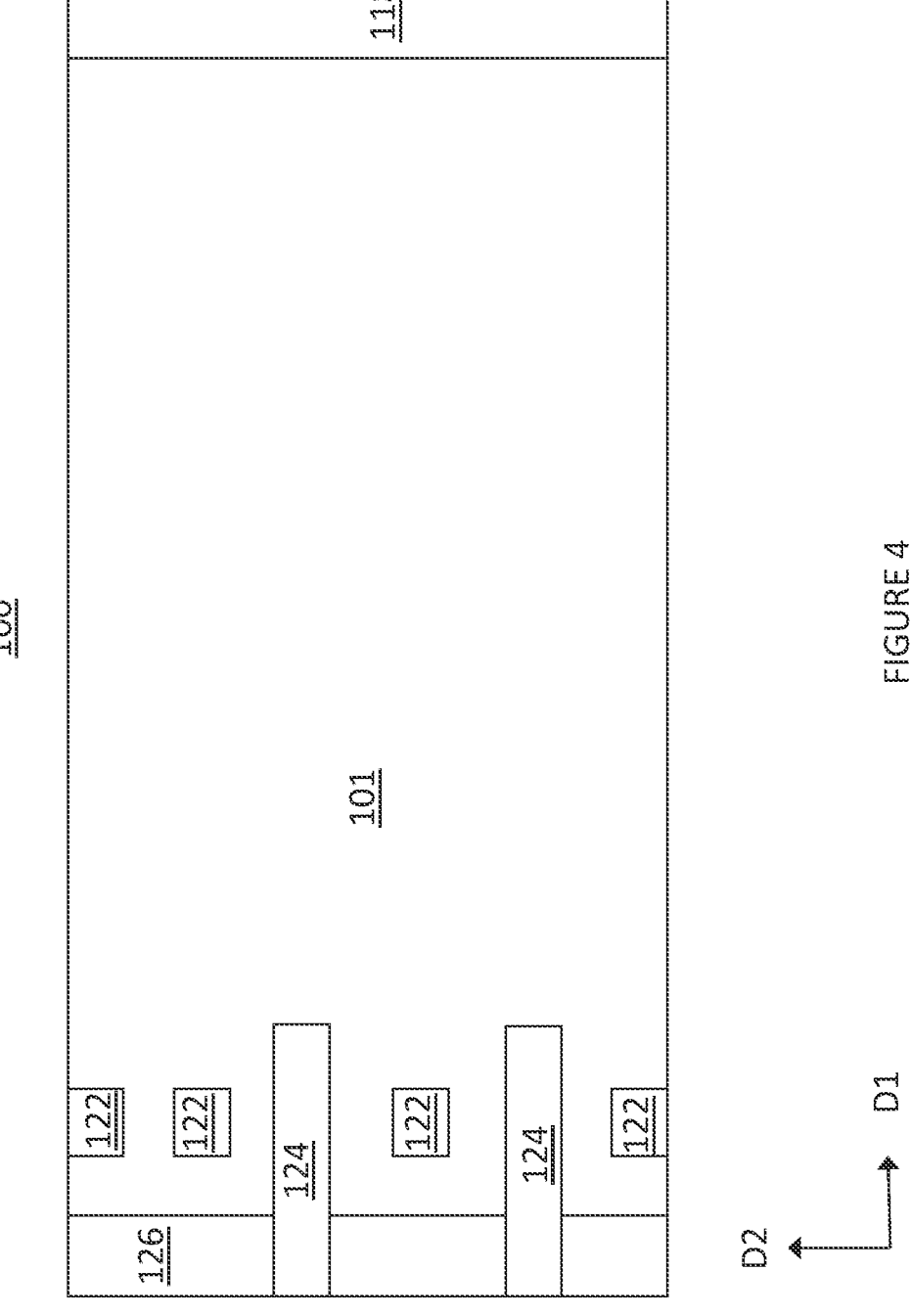
FIG. 4 illustrates a plan-view of a high-electron-mobility field effect transistor, according to an embodiment.

Referring to FIG. 4, the high-electron mobility transistor 100 is shown, according to another embodiment. The embodiment of FIG. 4 is similar to that of FIG. 3, except that the regions of second conductivity type semiconductor material that form the charge dissipation structure 124 are extended past the gate structure 120 and towards the drain electrode 118. As shown, the spacing of the gate columns 122 may be adjusted to accommodate the charge dissipation structure 124. By bringing the charge dissipation structure 124 closer to the drain, the amount of charges in the vicinity of the gate structure 120 is minimized, and hence the potential for leakage is minimized as well.

The device features disclosed herein, for example the charge dissipation structure 124 and/or barrier structure 128, can be incorporated into many different types of multi-channel high-electron mobility transistor devices. These different types of multi-channel high-electron mobility transistor devices can have different numbers of two-dimensional first charge carrier type gas channels and/or two-dimensional second charge type gas channels 112 from what is shown. The device concepts described herein are applicable to any device that includes at least two of the two-dimensional first charge type gas channels 110 forming the active device channels at least second charge type gas channels 112 that is in between the pair of two-dimensional first charge type gas channels 110. Examples of multi-channel high-electron mobility transistors are disclosed in U.S. Pat. No. 9,035,355 to Ostermaier, the content of which is incorporated by reference herein in its entirety, U.S. Pat. No. 9,647,104 to Ostermaier, the content of which is incorporated by reference herein in its entirety, U.S. Pat. No. 9,837,520 to Ostermaier, the content of which is incorporated by reference herein in its entirety, and U.S. Pat. No. 11,257,941 to Detzel, the content of which is incorporated by reference herein in its entirety.

Although the present disclosure is not so limited, the following numbered examples demonstrate one or more aspects of the disclosure.

Example 1. A high-electron mobility transistor, comprising: a semiconductor body comprising a plurality of type III-nitride semiconductor layers stacked on top of one another, thereby forming a plurality of two-dimensional first charge type gas channels and at least one two-dimensional second charge type gas channel vertically in between two of the two-dimensional first charge type gas channels, source and drain electrodes that are laterally spaced apart from one another and in ohmic contact with the plurality of two-dimensional first charge type gas channel; a gate structure configured to control a conductive connection between the source and drain electrodes by controlling a conductive state of the plurality of two-dimensional first charge type gas channels; and a charge dissipation structure that is configured to remove second charge type carriers from the at least one two-dimensional second charge type gas channel during an off-state of the high-electron mobility transistor.

Example 2. The high-electron mobility transistor of example 1, wherein the charge dissipation structure comprises one or more regions of second conductivity type semiconductor material extending through the plurality of type III-nitride semiconductor layers and directly interfacing with the at least one two-dimensional second charge type gas channel.

Example 3. The high-electron mobility transistor of example 2, wherein the charge dissipation structure and the source electrode are connected to the same potential.

Example 4. The high-electron mobility transistor of example 2, wherein the gate structure comprises a plurality of gate columns, and wherein each of the gate columns is a region of second conductivity type semiconductor material that extends through the plurality of type III-nitride semiconductor layers and directly interfaces with the at least one two-dimensional second charge type gas channel.

Example 5. The high-electron mobility transistor of example 4, further comprising a barrier structure that is laterally in between the gate structure and an access region of the high-electron mobility transistor, wherein the barrier structure forms an energy barrier that prevents second charge type carriers from flowing between the access region of the high-electron mobility transistor and the gate structure.

Example 6. The high-electron mobility transistor of example 5, wherein the barrier structure is a region of first conductivity type semiconductor material that extends through the plurality of type III-nitride semiconductor layers and separates the access region of the high-electron mobility transistor from the gate structure.

Example 7. The high-electron mobility transistor of example 5, wherein the charge dissipation structure is disposed within the access region.

Example 8. The high-electron mobility transistor of example 5, wherein the charge dissipation structure comprises a plurality of charge dissipation columns, wherein each of the charge dissipation columns is a region of second conductivity type semiconductor material that extends through the plurality of type III-nitride semiconductor layers and directly interfaces with the at least one two-dimensional second charge type gas channel.

Example 9. The high-electron mobility transistor of example 8, wherein the charge dissipation columns and the gate columns differ from one another with respect to at least one of the following parameters: dopant concentration; lateral spacing in a second direction that is perpendicular to a current flow direction of the high-electron mobility transistor; and total size.

Example 10. The high-electron mobility transistor of example 9, wherein the parameters of the charge dissipation columns and the gate columns are such that the plurality of two-dimensional first charge type gas channels in between the gate columns is fully depleted at zero gate-source voltage and the plurality of two-dimensional first charge type gas channels in between the charge dissipation columns is populated at zero gate-source voltage.

Example 11. The high-electron mobility transistor of example 2, wherein the gate structure comprises a gate electrode and an electrically insulating material or Schottky barrier between the at least one two-dimensional second charge type gas channel and the gate electrode.

Example 12. The high-electron mobility transistor of example 11, wherein the charge dissipation structure is at least partially overlapping with the source electrode.

Example 13. The high-electron mobility transistor of example 12, wherein the one or more regions of second conductivity type semiconductor material from the charge dissipation structure extend past the gate structure and towards the drain electrode.

Example 14. A method forming a high-electron mobility transistor, the method comprising: providing a semiconductor body comprising a plurality of type III-nitride semiconductor layers stacked on top of one another, thereby forming a plurality of two-dimensional first charge type gas channels and at least one two-dimensional second charge type gas channel vertically in between two of the two-dimensional first charge type gas channels, forming source and drain electrodes that are laterally spaced apart from one another and in ohmic contact with the plurality of two-dimensional first charge type gas channel; forming a gate structure that is configured to control a conductive connection between the source and drain electrodes by controlling a conductive state of the plurality of two-dimensional first charge type gas channels; and forming a charge dissipation structure that is configured to remove second charge type carriers from the two-dimensional second charge type gas channel during an off-state of the high-electron mobility transistor.

Example 15. The method of example 14, wherein forming the charge dissipation structure comprises forming one or more regions of second conductivity type semiconductor material that extend through the plurality of type III-nitride semiconductor layers and directly interface with the at least one two-dimensional second charge type gas channel.

Example 16. The method of example 15, wherein the gate structure comprises a plurality of gate columns, and wherein each of the gate columns is a region of second conductivity type semiconductor material that extends through the plurality of type III-nitride semiconductor layers and directly interfaces with the at least one two-dimensional second charge type gas channel.

Example 17. The method of example 16, wherein the method further comprises forming a barrier structure that is laterally in between the gate structure and an access region of the high-electron mobility transistor, wherein the barrier structure forms an energy barrier that prevents second charge type carriers from flowing between the access region of the high-electron mobility transistor and the gate structure.

Example 18. The method of example 17, wherein the charge dissipation structure is disposed within the access region, wherein the charge dissipation structure comprises a plurality of charge dissipation columns, and wherein each of the charge dissipation columns is a region of second conductivity type semiconductor material that extends through the plurality of type III-nitride semiconductor layers and directly interfaces with the at least one two-dimensional second charge type gas channel.

Example 19. The method of example 18, wherein forming the charge dissipation structure comprises configuring the charge dissipation structure to fully deplete the plurality of two-dimensional first charge type gas channels in between the plurality of charge dissipation columns only after the high-electron mobility transistor is turned off by the gate structure.

Example 20. The method of example 17, wherein forming the barrier structure comprises forming a trench having a minimum trench width and filling the trench with first conductivity type semiconductor material that is doped to form depletion regions that block the second charge type carriers from flowing between the access region of the high-electron mobility transistor and the gate structure.

In the above description, the heterojunction forming layers of the semiconductor body 102, i.e., the channel layer 108 and barrier layer 106, are disclosed as GaN based semiconductor layers. GaN is used for illustrative purposes only. More generally, any of a variety of combinations of type III-nitride semiconductor materials can be used to provide the device concept described herein. Examples of these materials include, inter alia, gallium arsenide (GaAs), gallium phosphide (GaP), indium phosphide (InP), indium gallium nitride (InGaN) and indium gallium arsenide (InGaAs). In a broad sense, the compound semiconductor transistors described herein can be formed from any binary, ternary or quaternary type III-nitride semiconductor materials where piezoelectric effects are responsible for the device concept.

The present specification refers to a "first charge carrier type" and a "second charge carrier type." In this context, the term "charge carrier type" refers to the polarity of charge carriers. The first charge carrier type may refer to electrons with the second charge carrier type referring to holes, or vice-versa. The "first charge carrier type gas channels" may refer to 2DEG channels and "second charge carrier type gas channels" may refer to 2DHG channels, or vice-versa.

The present specification refers to a "first conductivity type" semiconductor material and a "second conductivity type" semiconductor material. In this context, the term "conductivity type" refers to a net majority dopant type of the semiconductor material. First conductivity type semiconductor material may be n-type material and second conductivity type semiconductor material may be p-type material, or vice-versa.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel.

The term "electrically connected" intends to describe a low-ohmic electric connection between the elements electrically connected together, e.g., a connection via a metal and/or highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A high-electron mobility transistor, comprising:
a semiconductor body comprising a plurality of type III-nitride semiconductor layers stacked on top of one another, thereby forming a plurality of two-dimensional first charge type gas channels and at least one two-dimensional second charge type gas channel vertically in between two of the two-dimensional first charge type gas channels, source and drain electrodes that are laterally spaced apart from one another and in ohmic contact with the plurality of two-dimensional first charge type gas channel;

a gate structure configured to control a conductive connection between the source and drain electrodes by controlling a conductive state of the plurality of two-dimensional first charge type gas channels; and a charge dissipation structure that is configured to remove second charge type carriers from the at least one two-dimensional second charge type gas channel during an off-state of the high-electron mobility transistor.

2. The high-electron mobility transistor of claim 1, wherein the charge dissipation structure comprises one or more regions of second conductivity type semiconductor material extending through the plurality of type III-nitride semiconductor layers and directly interfacing with the at least one two-dimensional second charge type gas channel.

3. The high-electron mobility transistor of claim 2, wherein the charge dissipation structure and the source electrode are connected to the same potential.

4. The high-electron mobility transistor of claim 2, wherein the gate structure comprises a plurality of gate columns, and wherein each of the gate columns is a region of second conductivity type semiconductor material that extends through the plurality of type III-nitride semiconductor layers and directly interfaces with the at least one two-dimensional second charge type gas channel.

5. The high-electron mobility transistor of claim 4, further comprising a barrier structure that is laterally in between the gate structure and an access region of the high-electron mobility transistor, wherein the barrier structure forms an energy barrier that prevents second charge type carriers from flowing between the access region of the high-electron mobility transistor and the gate structure.

6. The high-electron mobility transistor of claim 5, wherein the barrier structure is a region of first conductivity type semiconductor material that extends through the plurality of type III-nitride semiconductor layers and separates the access region of the high-electron mobility transistor from the gate structure.

7. The high-electron mobility transistor of claim 5, wherein the charge dissipation structure is disposed within the access region.

8. The high-electron mobility transistor of claim 5, wherein the charge dissipation structure comprises a plurality of charge dissipation columns, wherein each of the charge dissipation columns is a region of second conductivity type semiconductor material that extends through the plurality of type III-nitride semiconductor layers and directly interfaces with the at least one two-dimensional second charge type gas channel.

9. The high-electron mobility transistor of claim 8, wherein the charge dissipation columns and the gate columns differ from one another with respect to at least one of the following parameters:

dopant concentration;

lateral spacing in a second direction that is perpendicular to a current flow direction of the high-electron mobility transistor; and total size.

10. The high-electron mobility transistor of claim 9, wherein the parameters of the charge dissipation columns and the gate columns are such that the plurality of two-dimensional first charge type gas channels in between the gate columns is fully depleted at zero gate-source voltage and the plurality of two-dimensional first charge type gas channels in between the charge dissipation columns is populated at zero gate-source voltage.

11. The high-electron mobility transistor of claim 2, wherein the gate structure comprises a gate electrode and an electrically insulating material or Schottky barrier between the at least one two-dimensional second charge type gas channel and the gate electrode.

12. The high-electron mobility transistor of claim 11, wherein the charge dissipation structure is at least partially overlapping with the source electrode.

13. The high-electron mobility transistor of claim 12, wherein the one or more regions of second conductivity type semiconductor material from the charge dissipation structure extend past the gate structure and towards the drain electrode.

* * * * *